United States Patent [19]

Toyoda

[11] Patent Number: 4,488,268
[45] Date of Patent: Dec. 11, 1984

[54] SEMICONDUCTOR MEMORY

[75] Inventor: Kazuhiro Toyoda, Yokohama, Japan

[73] Assignees: Fujitsu Limited, Kawasaki, Japan; Fujitsu Limited, Kawasaki, Japan

[21] Appl. No.: 425,649

[22] Filed: Sep. 28, 1982

[30] Foreign Application Priority Data

Sep. 29, 1981 [JP] Japan ............................. 56/152908
Sep. 30, 1981 [JP] Japan ............................. 56/155100
Mar. 30, 1982 [JP] Japan ............................. 57/50108

[51] Int. Cl.³ .......................................... G11C 13/00
[52] U.S. Cl. ...................................... 365/203; 365/230
[58] Field of Search ........................ 365/189, 230, 203

[56] References Cited

U.S. PATENT DOCUMENTS 4,156,941 5/1979 Homma et al. .
4,168,490 9/1979 Stinehelfer .

Primary Examiner—Terrell W. Fears
Attorney, Agent, or Firm—Staas & Halsey; Staas & Halsey

[57] ABSTRACT

A semiconductor memory includes memory cells and a discharge current source for quickly discharging electric charges, in the form of a discharge current, stored along the word lines. Each of the memory cells is comprised of a load transistor pair and a multi-emitter type detection transistor pair. The discharge current source controls the discharge current by means of a bias circuit formed in the discharge current source. The bias circuit control the value of the discharge current in accordance with the value of an inverse $\beta$ (current amplification factor) defined by the detection transistors.

15 Claims, 9 Drawing Figures

Fig. 8
Fig. 9
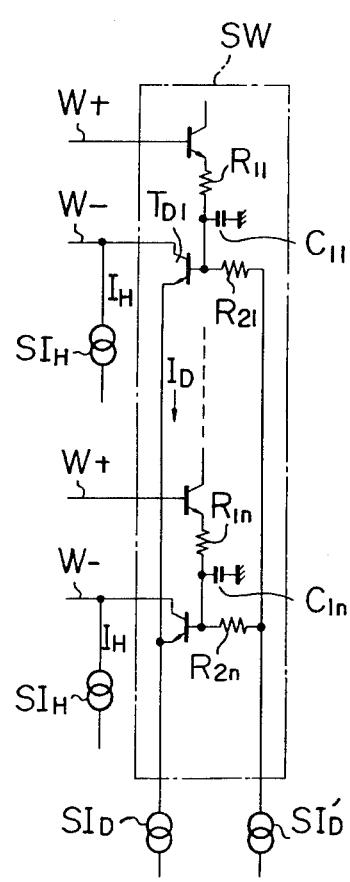
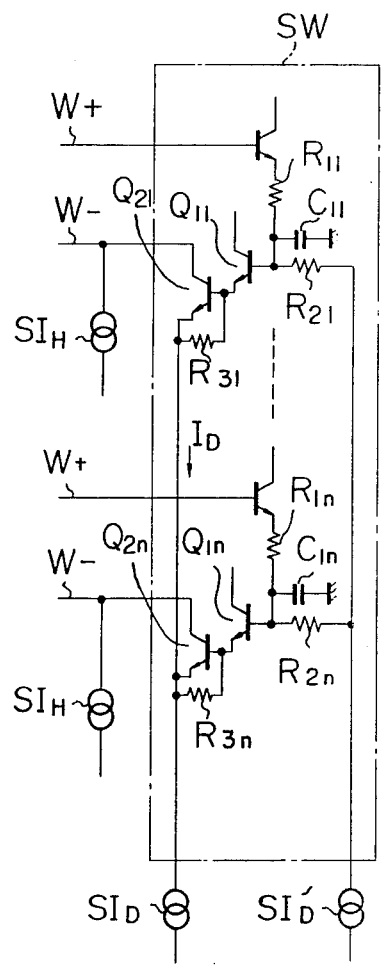

SEMICONDUCTOR MEMORY

BACKGROUND OF THE INVENTION

1. Field of the Invention

The present invention relates to a semiconductor memory circuit, more particularly to a semiconductor memory which is provided with a bias circuit for a word line current discharging circuit and, further, to a semiconductor memory fabricated by saturation-type memory cells each comprised of bipolar transistors.

2. Description of the Prior Art

A typical semiconductor memory is comprised of a plurality of word lines, a plurality of bit lines, and a plurality of memory cells located at the intersection of the word lines and bit lines. Semiconductor memories utilize various types of memory cells. The present invention relates to a semiconductor memory utilizing saturation-type memory cells.

Generally, in such a semiconductor memory, that is, a static semiconductor memory, a so-called holding current flows through each memory cell so as to maintain the stored data of logical "1" or "0". When the memory cell is to be changed from a half selected state to a nonselected state, the hold current is discharged. The greater the discharged holding current, the faster the switching speed from the half selected state to the nonselected state. However, from the viewpoints of large memory capacity and low power consumption, the discharged holding current ($I_H$) should preferably be small. Thus, it is difficult to increase the switching speed by making the hold current large. One previous proposal to get around this problem and achieve a fast switching speed is to have a discharging current ($I_D$) selectively absorbed from a selected word line.

Also in such a semiconductor memory, the emitter voltage of a detection transistor in each half selection memory cell is usually raised to a high level to prevent write errors. However, when the emitter voltage is raised to a high level, part of the discharging current ($I_D$) from the word lines is unnecessarily branched into the bit line connected to the detection transistor of each nonselection memory cell. This means that the discharging current ($I_D$) varies in accordance with the amount of the current which is branched into the detection transistor. Accordingly, the desired constant amplitude of the discharging current ($I_D$) cannot be maintained. This is because physical characteristics of the detection transistors obtained in one production lot are not always the same as those of the detection transistors obtained in another production lot.

SUMMARY OF THE INVENTION

It is an object of the present invention to maintain the discharging current ($I_D$) at a predetermined constant level regardless of the difference in production lots of the semiconductor memories.

The above object is attained by making use of the fact that a part of the discharging current ($I_D$) branched into the detection transistor varies in accordance with an inverse current gain $\beta$ (mentioned hereinafter) of the detection transistor. The present invention introduces into the semiconductor memory a means for controlling the inverse current gain $\beta$ to a constant value. The discharging current ($I_D$) can therefore be maintained at a predetermined constant level regardless of the production-lot differences in the inverse current gain $\beta$.

BRIEF DESCRIPTION OF THE DRAWINGS

The present invention will be more apparent from the ensuing description with reference to the accompanying drawings, wherein:

FIG. 8 is a detailed circuit diagram of the switching circuit shown in FIGS. 1 and 3; and FIG. 9 is a detailed circuit diagram of an improved switching circuit of FIG. 8.

DESCRIPTION OF THE PREFERRED EMBODIMENTS

Figure 1:
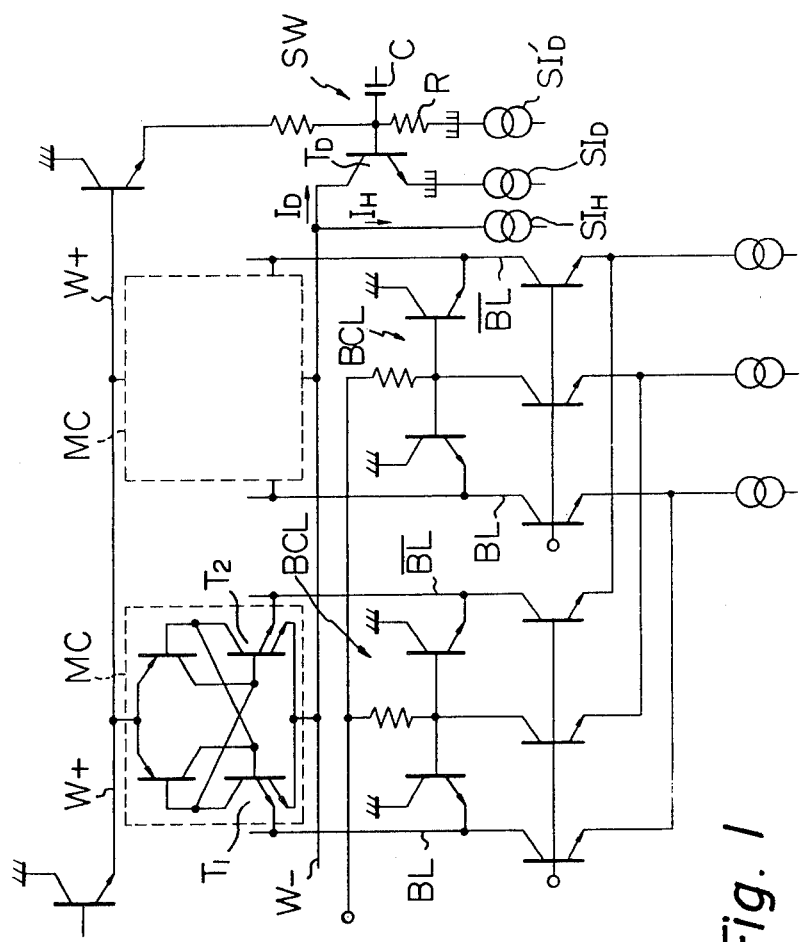
FIG. 1 is a circuit diagram of a part of prior art semiconductor memory to which the present invention is applied.

FIG. 1 is a circuit diagram of a part of a prior art semiconductor memory to which the present invention is applied. In FIG. 1, the symbols $W_+$ and $W_-$ represent a pair of word lines. Each memory cell MC is located between these word lines $W_+$ and $W_-$. It should be understood that many memory cells identical to MC and also many word lines identical to $W_+$ and $W_-$ exist in the semiconductor memory. Each memory cell MC is located also between a pair of bit lines BL and $\overline{BL}$. Many bit lines identical to BL and $\overline{BL}$ also exist in the semiconductor memory. Thus, a desired memory cell MC can be accessed by selecting the corresponding word line pair and the bit line pair.

In each memory cell MC, data of logical "1" or "0" is stored. The stored data is maintained as it is by a holding current $I_H$. The holding current $I_H$ is absorbed from the memory cell by means of a holding current source $SI_H$. When the word line $W_+$ changes from the selected state to the nonselected state, the electric charges stored along the word lines $W_+$ and $W_-$ are discharged together with the absorption of the holding current $I_H$. This means that the greater the holding current $I_H$, the faster the switching speed of the word line from the selected state to the nonselected state.

On the other hand, as previously mentioned, the holding current $I_H$ should preferably be small from the viewpoints of large memory capacity and low power consumption. However, such a small holding current $I_H$ impedes the high speed switching of the word line.

To overcome this problem, a discharging circuit has previously been proposed. The discharging circuit DC can absorb a discharging current $I_D$ from the selected word line $W_-$, selectively. Reference symbols $SI_D$ and $SI_D'$ represent different-type discharge current sources. Thus, the electric charges along the selected word lines $W_+$, $W_-$ are discharged together with not only the holding current $I_H$ but also the discharge current $I_D$, in a form of $I_H + I_D$. Therefore, a fast switching speed from the selected to the nonselected state can be attained.

A bit clamp circuit is already known. In FIG. 1, this circuit is referred to by a symbol BCL. When a transistor pair of each bit clamp circuit BCL is turned on, in the half selection memory cell MC (assuming the memory cell MC located at the right side of this figure is a half selection memory cell), the detection transistors thereof (not shown but identical to the detection transistors $T_1$ and $T_2$ of the left side memory cell MC) receive at their emitters a high-level voltage. This high-level voltage is useful for preventing write errors in the half selection memory cell. The above fact is already known.

Figure 2:
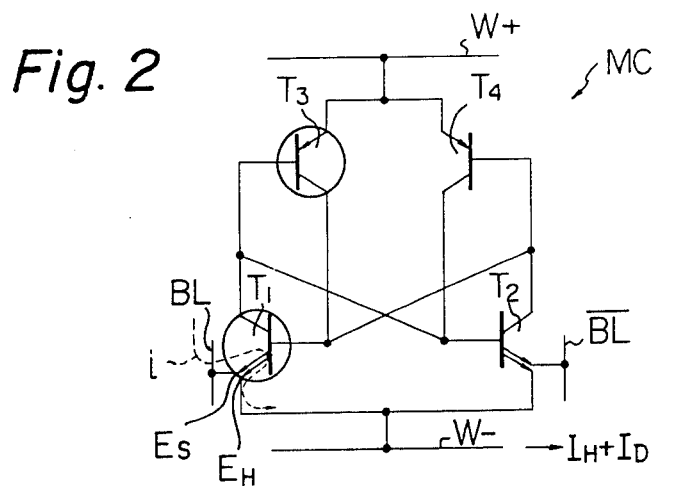
FIG. 2 is an enlarged view of one memory cell representative of the memory cells shown in FIG. 1.

Next, a detailed explanation of the memory cell MC will be made. FIG. 2 is an enlarged view of one memory cell representative of the memory cells MC shown in FIG. 1. The symbols BL, $\overline{BL}$, $W_+$, $W_-$, $T_1$, and $T_2$ have already been explained with reference to FIG. 1. Each of the detection transistors $T_1$ and $T_2$ is fabricated as a multi-emitter transistor. Symbols $T_3$ and $T_4$ represent load elements, such as load transistors of PNP type. The transistors enclosed by circles denote on transistors. When the memory cell MC is changed from the half selection state to the nonselection state, the electric charges stored along the word lines $W_+$ and $W_-$ are discharged in the form of the currents $I_H+I_D$.

The detection transistor $T_1$, for example, has a multi-emitter $E_S$ connected to the bit line BL and a multi-emitter $E_H$ connected to the word line $W_-$. It is known that, especially in a semiconductor memory fabricated by saturation-type memory cells, when the voltage at the multi-emitter $E_S$ is higher than the voltage at the multi-emitter $E_H$, the multi-emitter $E_S$ operates as a collector of an inverse transistor and, thereby, a current flows from the bit line BL to the emitter $E_H$ via the emitter $E_S$. The reason the voltage at the emitter $E_S$ is higher than that of the emitter $E_H$ has been mentioned in the explanation of the bit clamp circuit BCL, with reference to FIG. 1, in connection with the write error produced in the half selection memory cell. The above mentioned current, that is, the current flowing from the bit line BL to the emitter $E_H$, is referred to by the dotted line i. Due to the presence of the current i, the currents $I_H+I_D$ flowing from the word line $W_-$ contain the current i. This means that the current i impedes the discharge of the electric charges to be discharged from nodes existing in the memory cell MC when the memory cell MC is changed from the half selected state to the nonselected state. As a result, as previously mentioned, a part of the discharge current $I_D$ from the word lines $W_+$, $W_-$ is branched into the bit line of the nonselected memory cell.

The degree to which such a branched current i is created is determined by the current amplification factor $\beta$ of the detection transistor acting as the aforesaid inverse transistor, that is, the inverse $\beta$. To be specific, the greater the inverse $\beta$, the larger the branched current i from the bit line BL. Consequently, the greater the inverse inverse $\beta$, the lower the switching speed from the selected to the nonselected state. It should be noted that the value of the inverse $\beta$ is proportional to a usual current gain $\beta$.

The branched current i from the bit line BL occurs, as previously mentioned, only in the memory cell MC in which the voltage of the emitter $E_S$ is higher than the emitter $E_H$. The memory cells MC correspond to all the half selected memory cells connected to the same bit clamp circuit BCL which is activated. The total branched current i becomes very large due to the very large number of the half selected memory cells producing the current i. In the same bit line pair, only one memory cell is selected by a corresponding word line. If the total branched current i is too large, the semiconductor memory must be discarded as it will fail to meet product standards. This means, of course, all of the semiconductor memories in that production lot will have to be discarded as all will suffer from the same problem.

Theoretically, it would be possible to set up, in advance, a production lot in which the inverse $\beta$ of each semiconductor memory is made considerably small, whereby the branched current i would be made small. This would result in a considerably high switching speed because the electric charges could be rapidly be discharged from the half selection memory cells. However, this concept is not practical. If the inverse $\beta$ is set small, the load of the word line would be made unnecessarily large.

As understood from the above, neither a too large nor a too small inverse $\beta$ is preferable. In addition, it is difficult to guarantee a constant predetermined suitable value of the inverse $\beta$ in all production lots, because it is impossible in practice to maintain strictly uniform conditions for all production lots.

In the present invention, use is made of the fact that the amount of the branched current i varies in proportion to the variation of the value of the inverse $\beta$. Accordingly, in the present invention, specific means is employed to maintain that the inverse $\beta$ is substantially a constant. To be more specific, the specific means varies the amplitude of the discharge current $I_D$ generated by the discharge current source $SI_D$ in accordance with the value of the inverse $\beta$ of each production lot. That is, the discharge current $I_D$ is made relatively large for memory cells of production lots producing relatively large value of the inverse $\beta$, so that electric charges, stored at the nodes of each memory cell changing from the half selected state to the nonselected state, can rapidly be discharged via the discharge current source $SI_D$.

Figure 3:
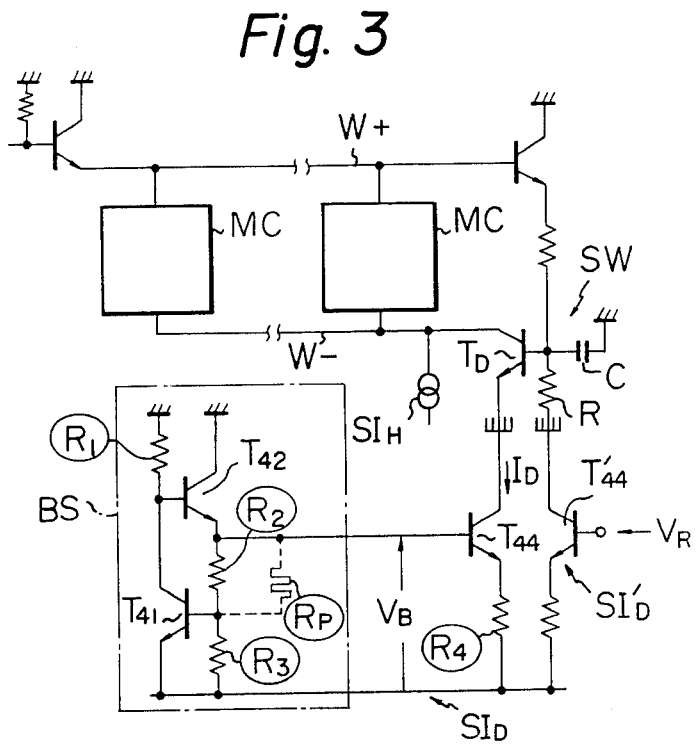
FIG. 3 is circuit diagram of a first embodiment of the present invention.

FIG. 3 is a circuit diagram of a first embodiment according to the present invention. It should be understood that FIG. 3 illustrates only the members needed for the explanation of the present invention. Other members are omitted. Also, in FIG. 3, reference symbols the same as in previous figures represent the same members. Therefore, attention should be paid, in FIG. 3, to a bias circuit BS. The bias circuit BS cooperates with the discharge current source $SI_D$ (also shown in FIG. 1) via a transistor $T_{44}$. A transistor $T_{44}'$ forms the aforesaid discharge current source $SI_D'$ (also shown in FIG. 1), which receives, at its base, a suitable reference voltage $V_R$.

In FIG. 3, a bias voltage $V_B$ is determined by the following equation (1) in connection with a base-emitter voltage $V_{BE1}$ of a transistor $T_{41}$ in the bias circuit BS.

$$V_B = \frac{R_2 + R_3}{R_3} \cdot V_{BE1} = \left( \frac{R_2}{R_3} + 1 \right) V_{BE1} \quad (1)$$

The symbols $R_2$ and $R_3$ in the above equation (1) denote respective resistance values of resistors $R_2$ and $R_3$ shown in FIG. 3.

The value of the discharge current $I_D$ is determined by the following equation (2).

$$I_D = \frac{V_B - V_{BE4}}{R_4} \quad (2)$$

Where, symbol $V_{BE4}$ denotes a base-emitter voltage of the transistor $T_{44}$, and symbol $R_4$ denotes a resistance value of a resistor $R_4$ shown in FIG. 3. In FIG. 3, a transistor $T_D$ forms a switching circuit SW having a CR time constant circuit. The transistor $T_D$ enables the discharge current $I_D$ to flow selectively with respect to the selected word lines $W_+$, $W_-$. The switching circuit SW ($T_D$, C, R) is useful for maintaining a continuous flow of the discharge current $I_D$ as long as possible even after the selected state of the word lines $W_+$, $W_-$ passes.

In view of the above equations (1) and (2), the following equation (3) stands, provided that the values of $V_{BE1}$ and $V_{BE4}$ are the same, that is $V_{BE1} = V_{BE4} = V_{BE}$. It should be noted that the relationship $V_{BE1} = V_{BE4}$ is usually true with respect to transistors fabricated in the same semiconductor memory chip.

$$I_D = \frac{1}{R_4}(V_B - V_{BE}) = \frac{1}{R_4}\left\{\left(\frac{R_2}{R_3} + 1\right)V_{BE} - V_{BE}\right\} \quad (3)$$
$$= \frac{1}{R_4} \cdot \frac{R_2}{R_3} \cdot V_{BE}$$

Figure 4A:
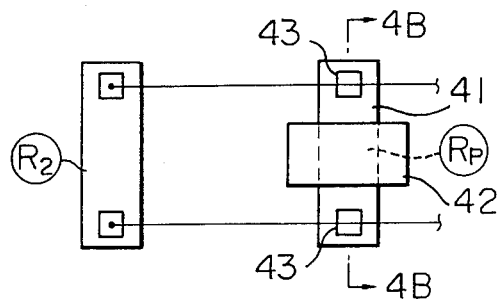
FIG. 4A is a plan view of the resistors shown in FIG. 3.
Figure 4B:
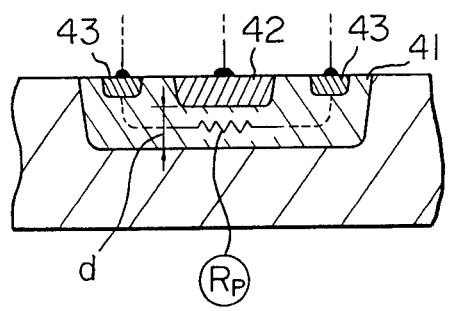
FIG. 4B is an enlarged cross-sectional view taken along the line 4B—B in FIG. 4A.

As understood from equation (3), since the value of $V_{BE}$ is constant, the value of the discharge current $I_D$ can be varied by varying one or more of the resistance values $R_2$, $R_3$, and $R_4$ of the resistors $R_2$, $R_3$, and $R_4$, respectively. This means that the discharge current $I_D$ can be controlled to be proportional to the value of the inverse $\beta$. In this case, it is most preferable that the control of such resistance values be achieved automatically, in accordance with the variation of the inverse $\beta$ in each production lot. Such automatic control can be achieved, according to the present invention, by utilizing a so-called pinched resistor. As known, a pinched resistor is created through a base layer, located right beneath an emitter layer. The resistance value $R_P$ of the pinched resistor is determined by the depth of the base layer under the emitter layer. In FIG. 3, the pinched resistor is schematically represented by a symbol $R_P$. The pinched resistor $R_P$ can be formed at a portion of an emitter diffusion resistor $R_2$ of the transistor $T_{42}$. The resistor $R_P$ can also be formed independently from the resistor $R_2$ or in parallel with the resistor $R_2$. FIG. 4A is a plan view of the resistors $R_2$ and $R_P$ shown in FIG. 3. FIG. 4B is an enlarged cross-sectional view taken along the line 4B—4B in FIG. 4A. As seen from FIG. 4B, the pinched resistor $R_P$ is formed in a first layer 41 and at the same time right beneath a second layer 42. The first layer 41 is identical to the base layer of the transistors formed in the same chip. The second layer 42 is identical to the emitter layer of the transistors formed in the same chip. The N-type layer 42 is positively biased with respect to the P-type layer 41. The characteristics of the pinched resistor $R_P$ will be explained immediately below.

Figure 5A:
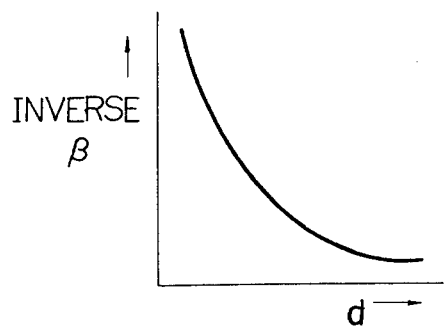
FIG. 5A and FIG. 5B are graphs used for explaining the characteristics of the pinch resistor shown in FIGS. 3, 4A, and 4B.
Figure 5B:
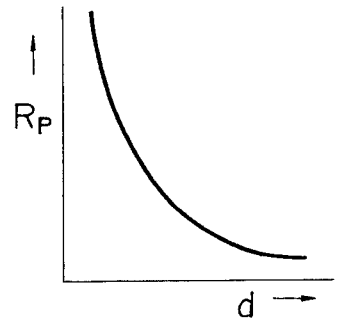

FIGS. 5A and 5B are graphs used for explaining the characteristics of the pinched resistor $R_P$ shown in FIGS. 3, 4A and 4B. The graph of FIG. 5A reveals a relationship between the depth d (see FIG. 4B) of the first layer 41 and the value of the inverse $\beta$. The graph of FIG. 5B reveals a relationship between the depth d and the resistance value of the pinched resistor $R_P$.

It will be apparent from the graphs of FIGS. 5A and 5B that both the inverse $\beta$ and the resistance value $R_P$ vary in proportion to the variation of the depth d. Due to the above, equation (3), $$I_D = \frac{1}{R_4} \cdot \frac{R_2}{R_3} \cdot V_{BE},$$

can be replaced with the following equation (4).

$$I_D = k \cdot R_P \quad (4)$$

Where, k represents a constant defined by $$\frac{V_{BE}}{R_4 \cdot R_3}$$

($R_3$, $R_4$, and $V_{BE}$ are all constant values). It should be understood that the resistance value $R_2$ of equation (3) is combined with the resistance value $R_P$ of equation (4) so as to be represented by the resistance value $R_P$ only. This is because the resistor $R_2$ functions merely as a predetermined adjusting resistor for the resistor $R_P$. As is apparent from equation (4), when the inverse $\beta$ is relatively large and accordingly the branched current i is large, the discharge current $I_D$ can also be made large. This is because, if the inverse $\beta$ is large, the resistance value $R_P$ is also large. Thus, the discharge current $I_D$ is automatically made large according to equation (4). Contrary to the above, when the inverse $\beta$ is relatively small and, accordingly, the branched current i is small, the discharge current $I_D$ can also be made small. This is because, if the inverse $\beta$ is small, the resistance $R_P$ is also small. Thus, the discharge current $I_D$ is automatically made small according to equation (4). As a result, the substantial discharge current $I_D$ through the memory cell can always be maintained to a desired level regardless of the variation of the inverse $\beta$. This enables high speed switching from the selected state to the nonselection state, especially when the inverse $\beta$ and the branched current i are large. As previously explained, in the prior art semiconductor memory, a large branched current i cancels the discharge current $I_D$, therefore, high speed switching is impossible.

Figure 6:
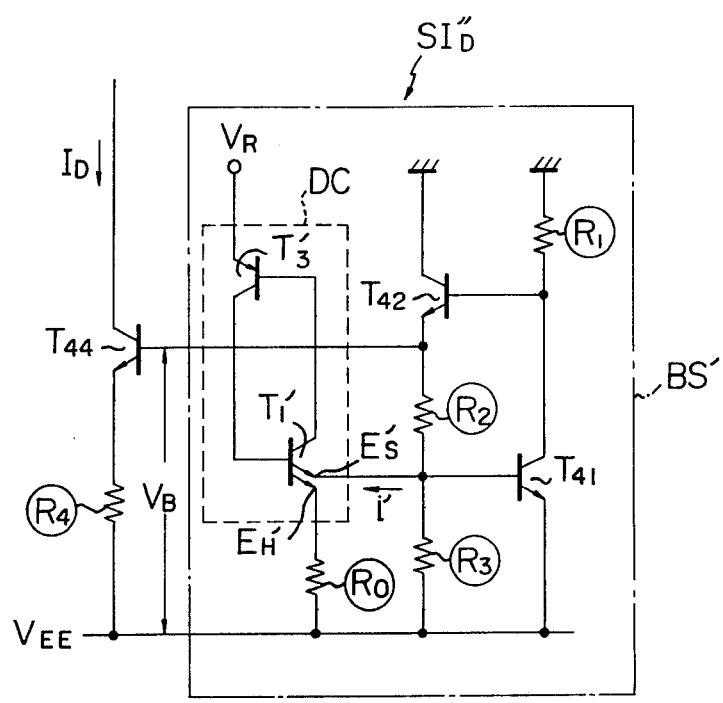
FIG. 6 is a circuit diagram of a second embodiment of the present invention.

FIG. 6 is a circuit diagram representing a second embodiment according to the present invention. This circuit corresponds to the discharge current source $SI_D$ of FIG. 1. The reference symbols which are the same as in FIG. 3 represent substantially the same members. The discharge current source $SI_D''$ comprises a bias circuit BS', which is different from the bias circuit BS of FIG. 3. The bias circuit BS' is comprised of a dummy cell DC in addition to the transistors $T_{41}$ and $T_{42}$ and the resistors $R_1$, $R_2$, $R_3$, and $R_4$ of the bias circuit BS shown in FIG. 3. The dummy cell DC has a similar construction to the memory cell MC shown in FIG. 2. That is, the dummy cell DC is comprised of a dummy detection transistor $T_1'$ and a dummy load transistor $T_3'$. A detection resistor $R_0$ is connected in series with the transistor $T_1'$. If such a dummy cell DC is not employed, the bias voltage $V_B$, that is, the base voltage of the transistor $T_{44}$, would be expressed by the following equation (5).

$$V_B = \frac{R_3 + R_2}{R_3} \cdot V_{BE41} \quad (5)$$

Where, $R_2$, $R_3$, and $V_{BE41}$ denote, respectively, resistance values of the resistors $R_2$, $R_3$ and the base-emitter voltage of the transistor $T_{41}$. The value of the discharge current $I_D$ is expressed by the following equation (6).

$$I_D = \frac{V_B - V_{BE44}}{R_4} \quad (6)$$

Where, $R_4$ and $V_{BE44}$ denote, respectively, the resistance value of the resistor $R_4$ and the base-emitter voltage of the transistor $T_{44}$. The values $V_{BE41}$ and $V_{BE44}$ are usually the same as each other, when these transistors are fabricated in the same semiconductor memory chip, that is $V_{BE41} = V_{BE44} = V_{BE}$. Thus, by using this voltage $V_{BE}$, the following equation (7) stands.

$$I_D = \frac{1}{R_4} \cdot \frac{R_2}{R_3} \cdot V_{BE} \quad (7)$$

Equation (7) is the same as equation (3). As previously mentioned, in the prior art, since the discharge current $I_D$ is not variable, the discharge currents from the half-selection memory cells are reduced if the branched current i is relatively large.

The current gain factor $\beta$ of each of the transistors $T_1'$ and $T_3'$ is almost the same as that of each of the transistors $T_1$ and $T_3$ in the real memory cell MC. The dummy cell DC and the detection resistor $R_0$ are connected between a reference voltage source $V_R$ and a power source $V_{EE}$. In this case, since the voltage across the dummy cell DC is constant, the voltage across the resistor $R_0$ is also constant. Accordingly, a constant current flows through the resistor $R_0$. A branched current i' flows into an emitter $E_S'$ of the multi-emitter transistor $T_1'$, in which the branched current i' is proportional to the inverse $\beta$ of the dummy detection transistor $T_1'$ as explained with reference to FIG. 2. Therefore, the bias voltage $V_b$, that is, the base voltage of the transistor $T_{44}$, is expressed by the following equation (8).

$$V_B = R_2 \left( \frac{V_{BE41}}{R_3} + i' \right) + V_{BE41} \quad (8)$$

The discharge current $I_D$ of FIG. 6 is expressed by the following equation (9), based on the above recited equation (6) and the fact that the base-emitter voltage of are transistors in the same chip is uniformally $V_{BE}$.

$$I_D = \frac{R_2}{R_4} \left( \frac{V_{BE}}{R_3} + i' \right) \quad (9)$$

Since the branched current i' is, as previously mentioned, proportional to the inverse $\beta$, the discharge current $I_D$ (refer to equation (9)) increases automatically if the inverse $\beta$ is relatively large. Thus, the discharge current from the half selection memory cell MC is not reduced even though the inverse $\beta$ and the current i are large. This is because the current i' of FIG. 6 is identical to the current i of FIG. 2.

Figure 7:
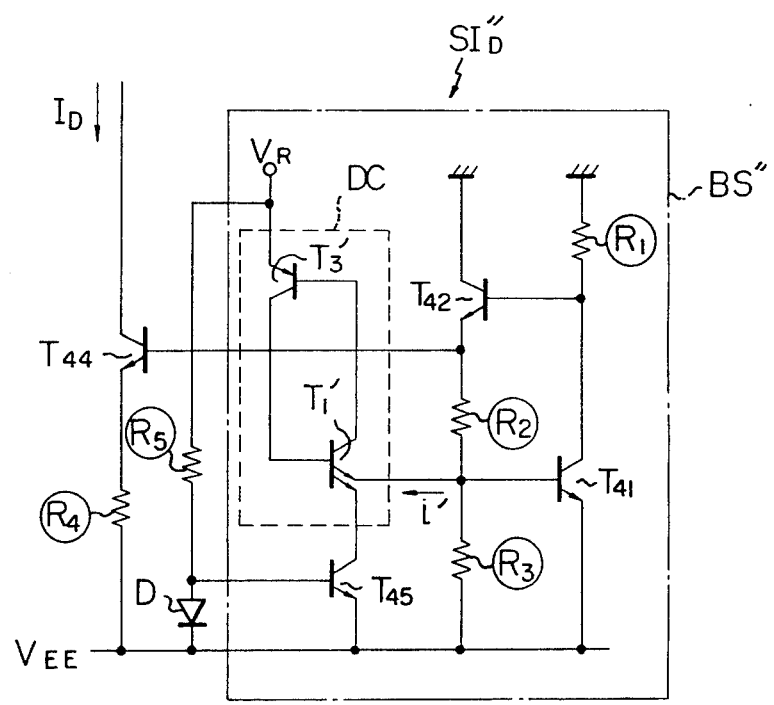
FIG. 7 is a circuit diagram of a third embodiment of the present invention.

FIG. 7 is a circuit diagram representing a third embodiment according to the present invention. The circuit of FIG. 7 differs from the circuit of FIG. 6 as follows. The detection resistor $R_0$ of FIG. 3 is replaced with a transistor $T_{45}$. The base of the transistor $T_{45}$ is provided with a diode D. The anode of the diode D is connected to $V_R$ via a resistor $R_5$, while the cathode thereof is connected to $V_{EE}$. Thus, both the diode D and the transistor $T_{45}$ create a known current-mirror circuit. Accordingly, a constant current flows through the transistor $T_{45}$, as in the resistor $R_0$ of FIG. 6, because the base voltage of the transistor $T_{45}$ is clamped at a constant level by the forward voltage of the diode D. Accordingly, equations similar to the above recited equations (8) and (9) also stand with respect to the circuit of FIG. 7.

As mentioned above with reference to the first through third embodiments, the discharge current $I_D$ varies in accordance with the variation of the inverse $\beta$ obtained in every production lot. Therefore, the switching speed of the word lines $W_+$, $W_-$ is improved. However, another problem is raised due to the variation of the discharge current $I_D$. This problem is produced from the switching circuit SW shown in FIG. 3. The switching circuit SW is common to the first through third embodiments, so the problem is common to all three embodiments. It should be understood, however, that the switching circuit SW itself is outside the present invention.

FIG. 8 is a detailed circuit diagram representing the switching circuit SW shown in FIGS. 1 and 3. In FIG. 8, there are n transistors $T_{D1}$ through $T_{Dn}$ for respective word lines $W_-$. There are also n resistors $R_{11}$ through $R_{1n}$ and n capacitors $C_{11}$ through $C_{1n}$ for respective word lines $W_-$, so that n CR time constant circuits are fabricated. As previously mentioned, each of the CR time constant circuits ($C_{11}R_{11}$ through $C_{1n}R_{1n}$) is useful for maintaining a continuous flow of the discharge current $I_D$ as long as possible even after the selected state of the word lines $W_+$, $W_=$ passes. Returning to FIG. 1, since the discharge current $I_D$ is not variable, the time constant CR is maintained constant. However, returning to FIG. 3, since the discharge current $I_D$ varies in accordance with the variation of the inverse $\beta$, base current of the selected transistor (any one of the transistors $T_{D1}$ through $T_{Dn}$) is also varied by the variation of the discharge current $I_D$. If the base current varies, the duration of the time constant CR also varies. Of course, the time constant must not vary. It must be constant so as to obtain uniform products of the semiconductor memories throughout all the production lots. Thus, the aforementioned problem, common to the first through third embodiments, resides in the above-mentioned variable base current and, accordingly, the variable time constant. In order to minimize the range in variation of the base current of each transistor ($T_{D1}$ through $T_{Dn}$), according to the present invention, each of the transistors $T_{D1}$ through $T_{Dn}$ is formed as a so-called Darlington connection transistor pair. FIG. 9 is a detailed circuit diagram representing the improved switching circuit of FIG. 8. As seen from FIG. 9, the transistors $T_{D1}$ through $T_{Dn}$ of FIG. 8 are replaced by Darlington connection transistor pairs $Q_{11}$, $Q_{21}$ through $Q_{1n}$, $Q_{2n}$, respectively. Each of the resistors $R_{31}$ through $R_{3n}$ is useful for preventing undesired oscillation induced by the Darlington amplifier. In FIG. 9, even though the discharge current $I_D$ flowing through the selection transistor (any one of the transistors $Q_{21}$ through $Q_{2n}$) varies in a wide range, the base current flowing through one corresponding transistor $Q_{11}$ through $Q_{1n}$ varies over a very small range due to such Darlington connections. This means that in spite of the wide variation of the current $I_D$, the time constant CR is maintained almost constant.

As mentioned above in detail, the semiconductor memory of the present invention can attain high speed switching from the selected state to the nonselected state of the word lines $W_+$, $W_-$, especially when the inverse $\beta$ is considerably large. When the inverse $\beta$ is considerably small, the semiconductor memory still maintains a constant predetermined switching speed.

I claim:

1. A semiconductor memory, comprising:
    a plurality of word lines;
    a plurality of bit lines intersecting said plurality of word lines;
    a plurality of memory cells having a selected state and a non-selected state, each comprising load elements, said load elements comprising load transistors and multi-emitter type detection transistors, respectively, operatively connected to said plurality of word lines and said plurality of bit lines at the intersections of said plurality of word lines and said plurality of bit lines, said mult-emitter type detection transistors defining an inverse current gain factor $\beta$;
    a discharge current source for discharging current from said plurality of memory cells when said plurality of memory cells are changed from a selected state to a nonselected state; and
    a bias circuit, operatively connected to said discharge current source, for controlling the discharge current, comprising:
        means for controlling the value of the discharge current, in accordance with the value of the inverse $\beta$ (current gain factor) defined by said multi-emitter type detection transistors.

2. A semiconductor memory as set forth in claim 1, wherein said means for controlling the value of the discharge current comprises a pinched resistor, included in said bias circuit, for controlling the value of the discharge current generated by said discharge current source, the resistance value of said pinched resistor being proportional to the value of the inverse $\beta$.

3. A semiconductor memory as set forth in claim 2, wherein each transistor formed in the semiconductor memory chip has a base layer of a first conductivity type and an emitter layer of a second conductivity type opposite the first conductivity type and wherein said pinched resistor comprises:
    a first layer of the first conductivity type and identical to the base layer of each transistor formed in the semiconductor memory chip; and
    a second layer of the second conductivity type and identical to the emitter layer of each transistor formed in the semiconductor memory chip and formed on said first layer.

4. A semiconductor memory as set forth in claim 2, further comprising a resistor, operatively connected to said pinched resistor, for adjusting the resistance value of said pinched resistor.

5. A semiconductor memory as set forth in claim 1, wherein said means for controlling the value of the discharge current comprises a dummy cell, operatively connected to said discharge current source, for controlling the value of the discharge current generated by said discharge current source, said dummy cell comprising load elements and a second transistor, operatively connected to said load elements, having a plurality of emitters, for operating as a memory cell, the value of the inverse $\beta$ defined by said second transistor of said dummy cell being substantially the same as the inverse $\beta$ defined by said detection transistors of said memory cells.

6. A semiconductor memory circuit as set forth in claim 5, having a constant current generating circuit, wherein said dummy cell further comprises a third transistor having a base, said third transistor operatively connected to a first of said plurality of emitters of said second transistor, for controlling the flow of the discharge current and feeding back a voltage proportional to the inverse $\beta$ to said base of said third transistor, and wherein a second of said plurality of emitters of said second transistors is operatively connected to said constant current generating circuit.

7. A semiconductor circuit as set forth in claim 6, wherein said constant current generating circuit comprises a resistor, operatively connected to said third transistor, having a constant voltage applied across said resistor.

8. A semiconductor memory circuit as set forth in claim 6, wherein the constant current generating circuit comprises:
    a fourth transistor, operatively connected to said second transistor of said dummy cell, having a base and an emitter; and
    a diode operatively connected between said base and emitter of said fourth transistor.

9. A semiconductor memory circuit, comprising:
    a plurality of word lines;
    a plurality of bit lines intersecting said word lines;
    a plurality of memory cells having a selected state and a non-selected state, each comprising load elements and multi-emitter type detection transistors, respectively, operatively connected at said intersections of said plurality of word lines and said plurality of bit lines, said multi-emitter type detection transistors defining an inverse current gain factor $\beta$;
    a discharge current source, operatively connected to said plurality of memory cells, for discharging current from said plurality of memory cells when said plurality of memory cells change from the selected state to the nonselected state;
    a bias circuit operatively connected to said discharge current source, for controlling the discharge current;
    a switching circuit, respectively, operatively connected to said plurality of word lines, commmprising:
        Darlington connected transistor pairs, operatively connected to said discharge current source, for discharging the current toward said discharging current source; and
        CR time constant circuits, respectively, operatively connected to said Darlington connected transistor pairs; and
    means, operatively connected to said switching circuit, for controlling the discharge current in accordance with the value of the inverse $\beta$ defined by said multi-emitter type detection transistors.

10. A semiconductor memory as set forth in claim 9, wherein said load elements comprise transistors.

11. A semiconductor memory circuit having word lines, bit lines intersecting the word lines, and memory cells located at the intersections of the word lines and bit lines, comprising:
  a discharge current source, operatively connected to the memory cells, for discharging current from the memory cells; and
  a bias circuit, operatively connected to said discharge current source, having a detection transistor for defining an inverse $\beta$ (current gain factor) and having a pinched resistor for controlling the discharge current in accordance with a variation of the inverse $\beta$ (current gain factor).

12. A semiconductor memory circuit having word lines, bit lines intersecting the word lines, memory cells located at the intersections of the word lines and bit lines, and operatively connected to a power source and a voltage source, the circuit comprising:
  a discharge current source, operatively connected to the memory cells, for discharging current from the memory cells, comprising:
    a bias circuit including a dummy cell, and detection means operatively connected to the power source and said dummy cell, said dummy cell comprising:
      a load transistor operatively connected to the voltage source; and
      a detection transistor having a plurality of emitters, including a first emitter operatively connected to said detection means and having a base and collector operatively connected to said load transistor.

13. A semiconductor memory circuit as set forth in claim 12, further comprising a diode operatively connected to said detection means and the power and voltage source.

14. A semiconductor memory circuit as set forth in claim 12, wherein said detection means is a resistor.

15. A semiconductor memory circuit as set forth in claim 13, wherein said detection means is a transistor.

* * * * *

UNITED STATES PATENT AND TRADEMARK OFFICE
CERTIFICATE OF CORRECTION

PATENT NO. : 4,488,268  Page 1 of 2
DATED : DECEMBER 11, 1984
INVENTOR(S) : KAZUHIRO TOYODA It is certified that error appears in the above-identified patent and that said Letters Patent is hereby corrected as shown below:

FRONT PAGE [73] "Assignees" should be --Assignee--; and
"Japan;" should be --Japan--;
line 2, delete line in its entirety.

[56] References Cited
Col. 2, line 1, insert the following:

--OTHER PUBLICATIONS

IEEE JOURNAL OF SOLID-STATE CIRCUITS, "An ECL 100K-Compatible 1024x4 Bit RAM with 15 ns Access Time", by Hans Glock et al., Vol. SC-14, No. 5, Oct. 1979--.

Col. 2, line 3, delete "; Staas &";
line 4, delete "Halsey".

THE DRAWINGS: "Figure 1" should be --Figure 1 (PRIOR ART)--;
"Figure 2" should be --Figure 2 (PRIOR ART)--.

UNITED STATES PATENT AND TRADEMARK OFFICE
CERTIFICATE OF CORRECTION

PATENT NO. : 4,488,268

DATED : DECEMBER 11, 1984

INVENTOR(S) : KAZUHIRO TOYODA

It is certified that error appears in the above-identified patent and that said Letters Patent is hereby corrected as shown below:

Col. 1, line 16, "intersection" should be --intersections--.

Col. 4, line 66, "The," should be --The--.

Col. 7, line 46, "$V_b$" should be --$V_B$--.

Col. 8, line 42, "$W_=$" should be --$W_-$--.

Col. 9, line 28, "mult-emitter" should be --multi-emitter--.

Signed and Sealed this

Twenty-fifth Day of June 1985

[SEAL]

Attest:

DONALD J. QUIGG

Attesting Officer    Acting Commissioner of Patents and Trademarks